(12) United States Patent
Lin et al.

(10) Patent No.: US 8,922,416 B2
(45) Date of Patent: Dec. 30, 2014

(54) METHOD AND APPARATUS FOR ANALOG-TO-DIGITAL CONVERTER

(71) Applicant: Marvell World Trade Ltd., St. Michael (BB)

(72) Inventors: Hung Sheng Lin, San Jose, CA (US); Shingo Hatanaka, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/871,633

(22) Filed: Apr. 26, 2013

(65) Prior Publication Data
US 2013/0285844 A1    Oct. 31, 2013

Related U.S. Application Data

(60) Provisional application No. 61/638,692, filed on Apr. 26, 2012.

(51) Int. Cl.
*H03M 1/34* (2006.01)
*H03M 1/66* (2006.01)
*H03M 3/00* (2006.01)
*H03M 1/12* (2006.01)
*H03M 1/56* (2006.01)
*H03M 1/80* (2006.01)
*H03M 1/00* (2006.01)

(52) U.S. Cl.
CPC . *H03M 1/12* (2013.01); *H03M 1/56* (2013.01); *H03M 1/66* (2013.01); *H03M 3/462* (2013.01); *H03M 1/804* (2013.01); *H03M 1/00* (2013.01)
USPC .......................................... 341/165; 341/155

(58) Field of Classification Search
CPC ........... H03M 1/00; H03M 1/12; H03M 1/56; H03M 1/804
USPC ................... 341/165, 155, 156, 120, 172, 169
See application file for complete search history.

(56) References Cited

U.S. PATENT DOCUMENTS 8,456,340 B2 * 6/2013 Kapusta et al. ................ 341/144

* cited by examiner

*Primary Examiner* — Joseph Lauture

(57) ABSTRACT

Aspects of the disclosure provide an analog-to-digital converter (ADC). The ADC includes a comparator module and a digital-to-analog converter (DAC). The comparator module is configured to compare a first voltage sampled from an analog signal and a second voltage output from the digital-to-analog converter (DAC), and output a pulse to indicate a result of the comparison. The DAC is configured to enable a switching unit corresponding to a digital bit to switch a state based on the pulse, and settle the second voltage.

17 Claims, 4 Drawing Sheets

METHOD AND APPARATUS FOR ANALOG-TO-DIGITAL CONVERTER

INCORPORATION BY REFERENCE

This present disclosure claims the benefit of U.S. Provisional Application No. 61/638,692, "Clockless Asynchronous SARADC" filed on Apr. 26, 2012, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Various electronic devices include an analog-to-digital converter (ADC) as a signal processing component. The ADC samples an analog signal and converts the sampled analog signal to digital values. The digital values can be further processed using digital signal processing techniques.

SUMMARY

Aspects of the disclosure provide an analog-to-digital converter (ADC). The ADC includes a comparator module and a digital-to-analog converter (DAC). The comparator module is configured to compare a first voltage sampled from an analog signal and a second voltage output from the digital-to-analog converter (DAC), and output a pulse to indicate a result of the comparison. The DAC is configured to enable a switching unit corresponding to a digital bit to switch a state based on the pulse, and settle the second voltage.

In an embodiment, the comparator module is configured to select one of a pair of output signals based on the result of the comparison and output the pulse in the selected output signal. Further, in an example, the comparator module is configured to avoid a pulse output from the non-selected output signal at the same time with the selected output signal.

According to an embodiment of the disclosure, the comparator module includes a reset control circuit configured to reset circuits in the comparator module in response to the pulse. The comparator module resets at the same time the DAC settles the second voltage.

According to an aspect of the disclosure, the DAC includes multiple switching units corresponding to digital bits of a digital value, and the multiple switching units are enabled in a chain to switch based on pulses output from the comparator module. In an example, the switching unit is configured to enable a next switching unit when its state has been revolved.

According to an aspect of the disclosure, the comparator module does not output a clock signal.

Aspects of the disclosure also provide a method. The method includes comparing a first voltage sampled from an analog signal with a second voltage settled by a digital-to-analog converter (DAC), generating a pulse to indicate a result of the comparison and enabling a switching unit in the DAC corresponding to a digital bit to switch a state based on the pulse.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
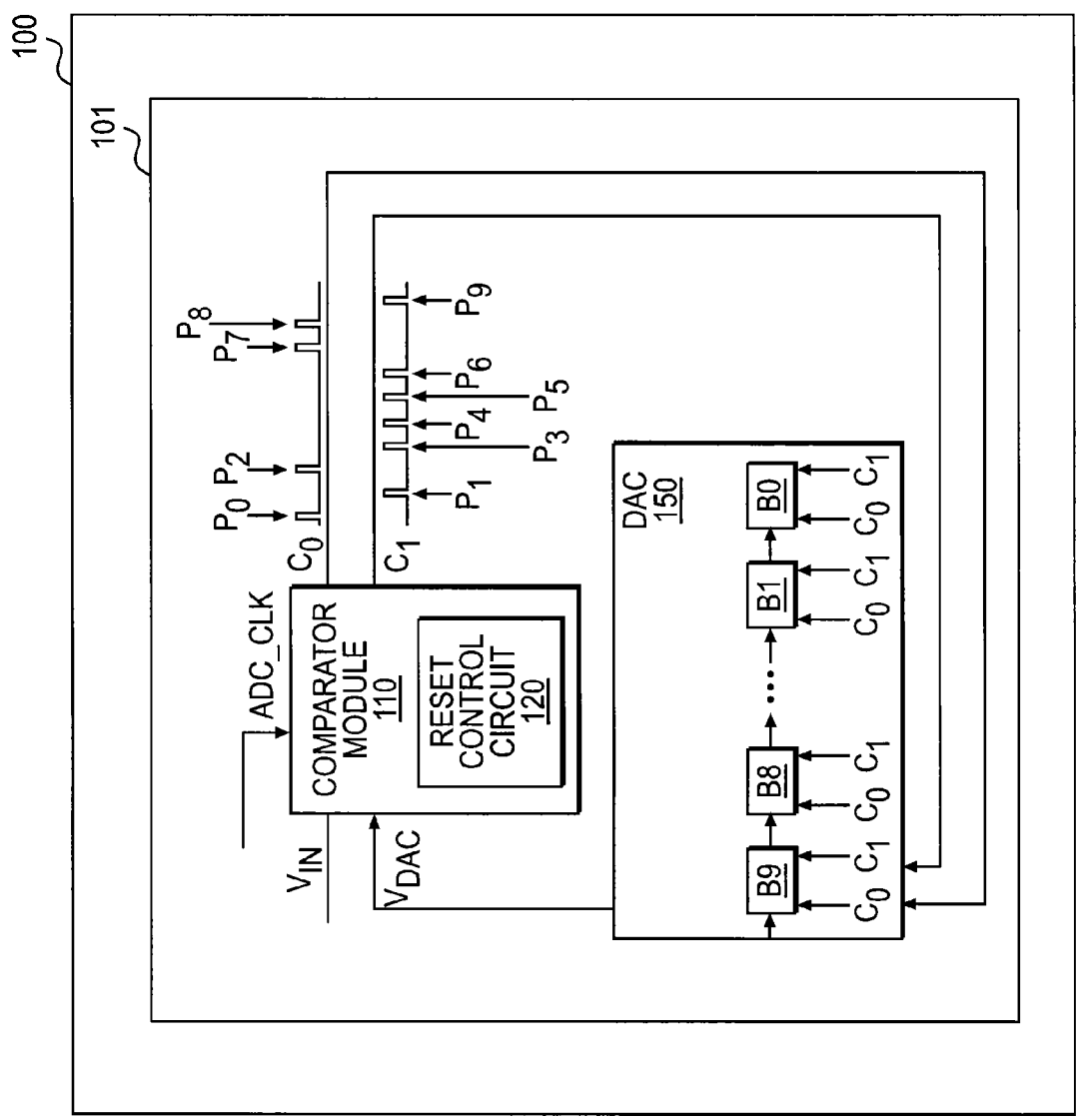
FIG. 1 shows a block diagram of an integrated circuit (IC) chip example 100 according to an embodiment of the disclosure.

FIG. 1 shows a block diagram of an integrated circuit (IC) chip example 100 according to an embodiment of the disclosure. The IC chip 100 includes an analog to digital converter (ADC) 101 to sample an analog signal and convert the sampled analog signal into digital values. The IC chip 100 can include other suitable circuit components (not shown), such as an analog signal processing circuit (not shown) to prepare the analog signal, a digital signal processing circuit (not shown) to process the digital values, and the like. The IC chip 100 can be a system-on-chip (SOC), or can be a part of any suitable system, such as a computer, a laptop, a Blu-ray player, a sensor device, an automobile, and the like.

In the FIG. 1 example, the ADC 101 is a successive approximation type ADC that, for each conversion of a sample of the analog signal, performs a number of binary searches through all possible quantization levels before finally converging upon a digital value, such as a number of bits corresponding to a voltage level, or a current level of the analog signal. The ADC 101 includes a comparator module 110 and a digital-to-analog converter (DAC) 150 coupled together as shown in FIG. 1.

In the FIG. 1 example, the comparator module 110 receives a first voltage $V_{IN}$ corresponding to a sample of the analog signal for conversion, and a second voltage $V_{DAC}$ output from the DAC 150, and compares the first voltage $V_{IN}$ with the second voltage $V_{DAC}$. Based on the comparison, the comparator module 110 outputs a pulse in one of a first pulse output $C_0$ and a second pulse output $C_1$. In an example, when the first voltage $V_{IN}$ is higher than the second voltage $V_{DAC}$, the comparator module 110 outputs a pulse in the second pulse output $C_1$, and when the first voltage $V_{IN}$ is lower than the second voltage $V_{DAC}$, the comparator module 110 outputs a pulse in the first pulse output $C_0$. In an embodiment, the comparator module 110 is configured such that, a comparison result is output in the form of a pulse from one and only one of the first pulse output $C_0$ and the second pulse output $C_1$.

Further, in an embodiment, the comparator module 110 is configured to reset the circuits in the comparator module 110 by itself after a comparison to prepare for a next comparison. In the FIG. 1 example, the comparator module 110 includes a reset control circuit 120 to reset the circuits in the comparator module 110 in response to each pulse in the first and second pulse outputs $C_0$ and $C_1$. For example, when the first pulse output $C_0$ outputs a pulse, the reset control circuit 120 resets the circuits in the comparator module 110, and when the second pulse output $C_1$ outputs a pulse, the reset control circuit 120 resets the circuits in the comparator module 110. In an example, the comparator module 110 takes a reset time to reset the circuits in the comparator module 110, and takes a comparison time to make the comparator decision. It is noted that the comparison time for the comparator decision may vary. In an embodiment, once enabled, the comparator module 110 repetitively performs a reset operation and a comparison operation before being disabled.

The DAC 150 receives the two pulse outputs $C_0$ and $C_1$, and progressively resolves bit values of a digital value corresponding to the voltage level of the analog signal. According to an embodiment of the disclosure, the DAC 150 includes a plurality of chained circuit units, such as B9 to B0 in FIG. 1, corresponding to the bits of the digital value. For example, the digital value has ten bits. The circuit unit B9 corresponds to a most significant bit bit-9 of the digital value, the circuit unit B8 corresponds to bit-8 of the digital value, so forth, the circuit unit B1 corresponds to bit-1 of the digital value, and the circuit unit B0 corresponds to a least significant bit bit-0 of the digital value. Each circuit unit receives the first and second pulse outputs $C_0$ and $C_1$, and a control signal from a previous circuit unit in the chain. In an embodiment, the control signal has an enable state that enables the circuit unit to operate in response to the first and the second pulse outputs $C_0$ and $C_1$, and has a disable state that does not allow the circuit unit to operate in response to the first and the second pulse outputs $C_0$ and $C_1$. Further, the enable state can be passed along the chain to enable the circuit units B9 to B0 one by one to resolve their states in response to pulses in the first and second pulse outputs $C_0$ and $C_1$.

In an example, each circuit unit includes one or more switching circuits configured to switch to a state corresponding to a bit value based on the first and second pulse outputs $C_0$ and $C_1$ once the circuit unit is enabled. For example, once enabled, the circuit unit can switch to a logic "0" state corresponding to a binary value "0" when the first pulse output $C_0$ has a pulse, and can switch to a logic "1" state corresponding to a binary value "1" when the second pulse output C1 has a pulse. When the enable state is passed along the chain one by one, the circuit units B9 to B0 resolve the states corresponding to the bit values of the digital value based on the first and second pulse outputs $C_0$ and $C_1$.

Further, the DAC 150 converts the states of the circuit units B9 to B0 to the second voltage $V_{DAC}$. According to an aspect of the disclosure, the DAC 150 takes a logic delay time for switching the states of the circuit units B9-B0 in response to a pulse in the first and second pulse outputs $C_0$ and $C_1$, and takes a settling time for settling the second voltage $V_{DAC}$ to a level corresponding to the states of the circuit units B9-B0. In an example, the DAC 150 is suitably configured that a sum of the logic delay time and the settling time is about the same as the reset time of the comparator module 110. Thus, while the DAC 150 switches the states and converts the states to the second voltage $V_{DAC}$, the comparator module 110 resets and gets ready for the next comparison.

During operation, in an example, the comparator module 110 is triggered by a clock signal ADC_CLK to start operation. In an example, the ADC 101 includes a sample and hold circuit (not shown) configured to sample an analog signal, and generate the first voltage $V_{IN}$ in response to, for example, a rising edge of the clock signal ADC_CLK. Further, the sample and hold circuit holds the voltage level of the first voltage $V_{IN}$ until a next rising edge of the ADC_CLK. Further, the ADC 101 starts a conversion in response to the rising edge.

Specifically, in an example, the DAC 150 initiates the control signal to the circuit unit B9 to the enable state in response to the rising edge of the clock signal ADC_CLK. When the circuit unit B9 is enabled, the circuit unit B9 is initiated to the logic "1" state. In an example, because the other circuit units B8-B0 haven't been enabled, they are in a default state, such as a logic "0" state. In the example, the DAC 150 generates and settles the second voltage $V_{DAC}$ corresponding to a binary sequence "1000000000".

Then, the comparator module 110 compares the first voltage $V_{IN}$ with the second voltage $V_{DAC}$. In the FIG. 1 example, the first voltage $V_{IN}$ is higher than the second voltage $V_{DAC}$, the comparator module 110 outputs a pulse (e.g., P9) in the second pulse output $C_1$. In response to the pulse output, the reset control circuit 120 generates a reset signal, such as a rest pulse, and the like, to reset the circuits in the comparator module 110.

When the DAC 150 receives the pulse P9 in the second pulse output $C_1$, the circuit unit B9 maintains the state and passes the enable state to the circuit unit B8 in response to the pulse P9. When the circuit unit B8 is enabled, the circuit unit B8 is initiated to the logic "1" state. Because the other circuit units B7-B0 haven't been enabled, they are in the default state, such as logic "0" state. The DAC 150 settles the second voltage $V_{DAC}$ corresponding to a binary sequence "1100000000".

The comparator module 110 then compares the first voltage $V_{IN}$ with the second voltage $V_{DAC}$. In the FIG. 1 example, the first voltage $V_{IN}$ is lower than the second voltage $V_{DAC}$, the comparator module 110 outputs a pulse (e.g., P8) in the first pulse output $C_0$. In response to the pulse output, the reset control circuit 120 resets the circuits in the comparator module 110.

When the DAC 150 receives the pulse P8 in the first pulse output $C_0$, the circuit unit B8 switches to the logic "0" state and passes the enable state to circuit unit B7 in response to the pulse P8.

The process can be repetitively executed to resolve the states of the circuit units B7-B0. After the circuit unit B0 finalizes its state based on pulse P0 for example, the DAC 150 outputs the digital value corresponding to the states of the circuit units B9 to B0, and may also output a done signal indicative of a finish of the conversion.

According to an aspect of the disclosure, the operation of the ADC 101 does not require a high frequency clock signal, such as a clock signal having a frequency that is multiple times of the clock signal ADC_CLK.

In an implementation of a related ADC, a comparator outputs a static output and an asynchronous clock signal having much higher frequency than the ADC_CLK. The static output is indicative of the comparison result, and the asynchronous clock signal provides timing information for the static output. In an example, the asynchronous clock signal has a rising edge with a delay to an output of the comparison result. The related ADC includes successive approximation registers (SAR) that operate based on the asynchronous clock signal to generate control signals for a DAC within the related ADC.

According to an aspect of the disclosure, the ADC 101 can be configured to have a faster speed than the related ADC. In an example, each bit of the ADC 101 is resolved in a bit cycle. The bit cycle includes the reset time and the comparator decision time. During the comparator decision time, the comparator module 110 compares the first voltage $V_{IN}$ with the second voltage $V_{DAC}$, and outputs a pulse in one of the first and second pulse outputs based on the comparison. In an example, the comparison decision time may vary from bit to bit. During the comparator reset time, the comparator module 110 resets internal circuits to prepare for a next comparison. At the same time during the comparator rest time, the DAC 150 switches states based on the pulse in the first and second pulse outputs, and settles the second voltage $V_{DAC}$ accordingly.

For the related ADC, each bit cycle includes a comparator decision time, a delay between the static output and the asynchronous clock, a register delay, and a settling delay for the DAC within the related ADC. Because the sum of the delay between the static output and the asynchronous clock, the register delay, and the settling delay for the DAC is larger than the comparator reset time, in an example, the related ADC includes a delay circuit to introduce additional delay in the comparator reset time to match the sum. Thus, the bit cycle for the related ADC is longer than the bit cycle of the ADC 101. Thus, in an example, the clock signal ADC_CLK's frequency can be increased.

According to another aspect of the disclosure, the ADC 101 has a reduced number of critical global routing signals than the related ADC. In the FIG. 1 example, the comparator module 110 passes two pulse output signals to the DAC 150. The control signals in the DAC 150 can be routed using local routing resources from one circuit unit to another circuit unit. In the related ADC example, the comparator outputs the static output and the asynchronous clock signal to the SAR registers of the related ADC, the SAR registers outputs multiple control signals, such as ten control signals for ten-bit DAC. The static output, the asynchronous clock signal, the control signals, the enable signal may require global routing resources. In addition, in an example, the delay circuit also generates an enable signal that needs to be globally routed.

According to another aspect of the disclosure, the ADC 101 consumes a reduced silicon area than the related ADC. In an example, the chain function in the DAC 150 is implemented using ten switches with three gates in each switch. The related ADC uses ten SAR registers to control the successive bits resolving, and consume more silicon area.

It is noted that, in the FIG. 1 example, the components of the ADC 101 are implemented on one IC chip. In another example, the components of the ADC 101 may be implemented on multiple chips, and are coupled together across the multiple chips.

Figure 2:
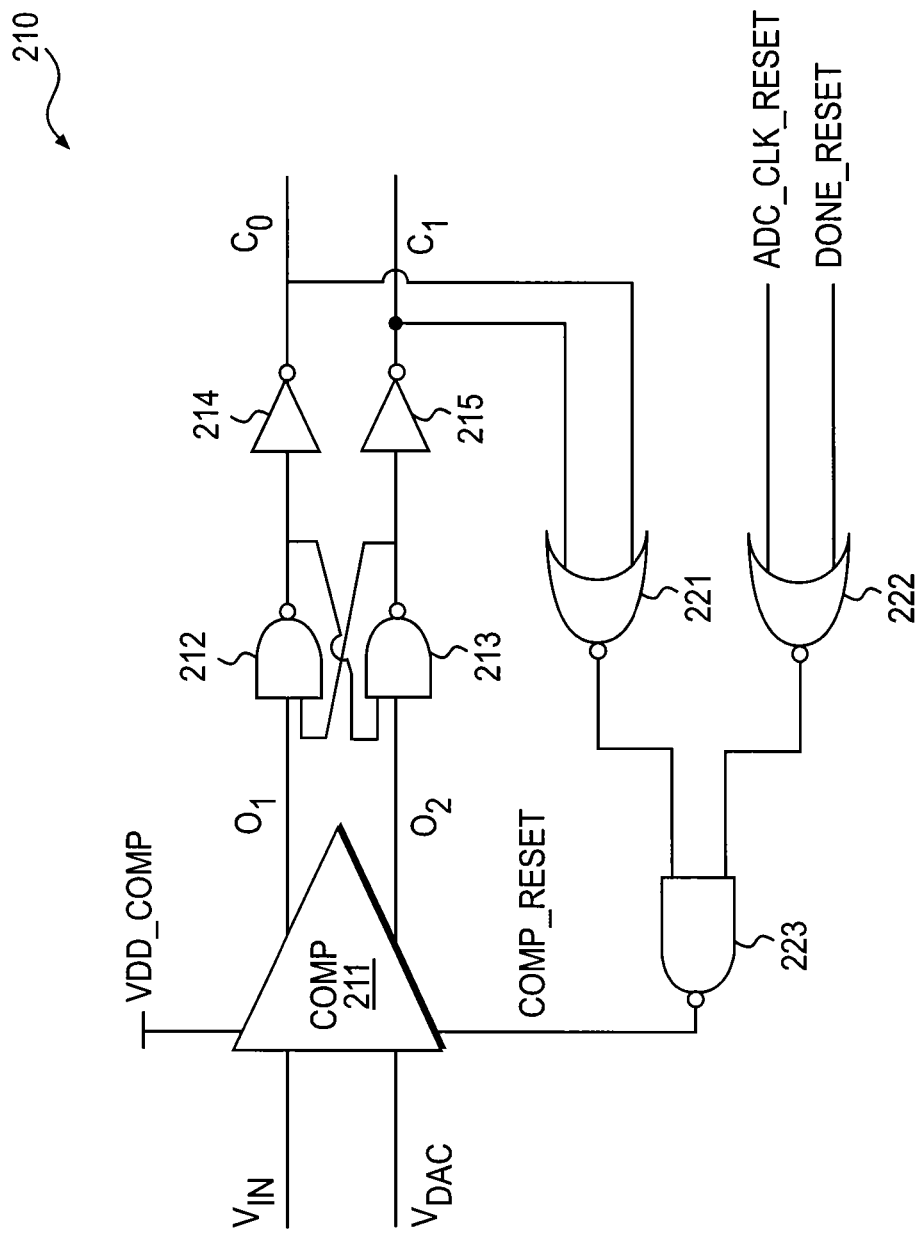
FIG. 2 shows a diagram of a comparator module example 210 according to an embodiment of the disclosure.

FIG. 2 shows a diagram of a comparator module 210 according to an embodiment of the disclosure. In an example, the comparator module 210 is used in the ADC 101 as the comparator module 110. The comparator module 210 includes a comparator (COMP) 211, two cross-coupled NAND gates 212 and 213, two inverters 214 and 215, two NOR gates 221 and 222, and a NAND gate 223. These elements are coupled together as shown in FIG. 2.

In an embodiment, the comparator 211 receives a first voltage $V_{IN}$ and a second voltage $V_{DAC}$, compares the first voltage and the second voltage, and generates a pulse in one of two outputs $O_1$ and $O_2$ based on the comparison. In an example, the two outputs $O_1$ and $O_2$ are reset to a relatively low voltage level before comparison. When the first voltage $V_{IN}$ is larger than the second voltage $V_{DAC}$, the comparator 211 outputs a positive pulse in the output $O_2$, and when the first voltage $V_{IN}$ is lower than the second voltage $V_{DAC}$, the comparator 211 outputs a positive pulse in the output $O_1$.

The cross-coupled NAND gates 212 and 213 and the inverters 214 and 215 form a latch to regenerate pulse outputs $C_0$ and $C_1$. In an example, due to capacitive coupling, when one output has a real pulse, the other output has a false pulse. The real pulse is generally stronger than the false pulse. The latch passes the stronger pulse, and removes the weaker pulse, such that one and only one pulse output ($C_0$ or $C_1$) has a pulse.

The two NOR gates 221 and 222 and the NAND gate 223 form a reset control circuit. The reset control circuit generates a reset signal COMP_RESET to trigger the comparator 211 to reset under various situations. In an example, when one of the pulse outputs $C_0$ or $C_1$ has a pulse, the reset control circuit generates a pulse in the reset signal COMP_RESET to reset the circuits in the comparator 211. In another example, when an ADC clock signal, such as the clock signal ADC_CLK in FIG. 1, has a rising edge, a signal ADC_CLK RESET has a pulse, and then the reset control circuit generates a pulse in the reset signal COMP_RESET to reset the circuits in the comparator 211. In another example, when the LSB bit has been resolved, a signal DONE_RESET has a pulse in response to a finish of the ADC conversion, the reset control circuit generates a pulse in the reset signal COMP_RESET to reset the circuits in the comparator 211.

Figure 3:
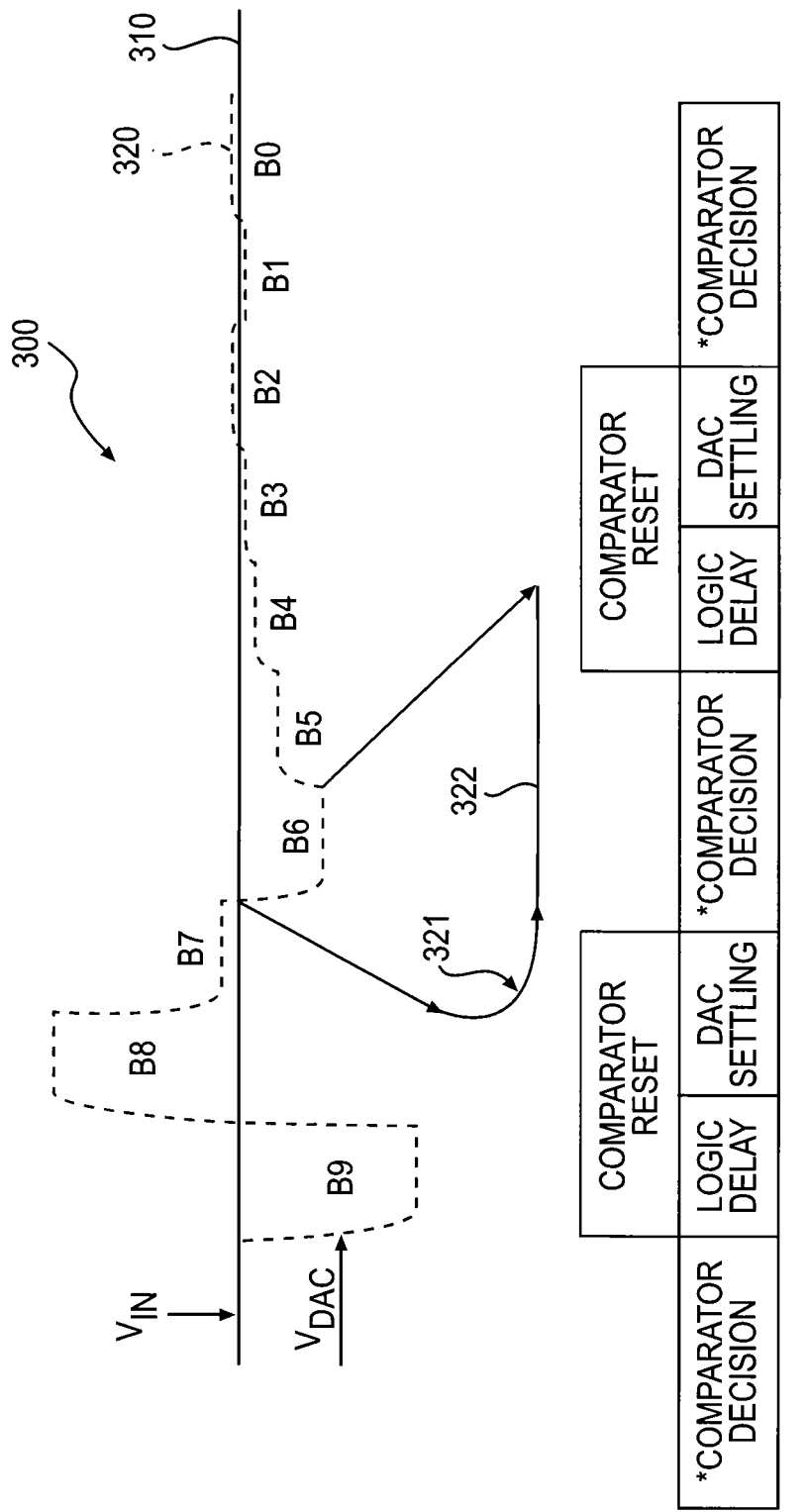
FIG. 3 shows a timing diagram example 300 according to an embodiment of the disclosure.

FIG. 3 shows a timing diagram example 300 for an analog to digital conversion using the ADC 101 according to an embodiment of the disclosure. The diagram 300 includes a first curve 310 for the first voltage $V_{IN}$, and a second curve 320 for the second voltage $V_{DAC}$. The first voltage $V_{IN}$ is sampled from an analog signal for conversion, and is held relatively stable during the conversion time. The second voltage $V_{DAC}$ is output from the DAC 150 for example. The DAC 150 progressively resolves the bit values of a digital value corresponding to the first voltage $V_{IN}$ from the most significant bit (MSB), such as bit-9, to the least significant bit (LSB), such as bit-0, based on the comparison of the first voltage $V_{IN}$ with the second voltage $V_{DAC}$, and settles the second voltage $V_{DAC}$ based on the resolved bit values. As a result, the second voltage $V_{DAC}$ varies and approaches the first voltage $V_{IN}$ gradually.

Specifically, in an example, during a time for resolving the state for the circuit unit B9, the circuit unit B9 is initiated to the logic "1" state, and the DAC 150 settles the second voltage $V_{DAC}$ corresponding to a binary sequence "1000000000". Because the first voltage $V_{IN}$ is higher than the second voltage $V_{DAC}$, the comparator module 110 outputs a pulse in the second pulse output $C_1$ (e.g., P9 in FIG. 1). In response to the pulse output, the reset control circuit 120 resets the circuits in the comparator module 110. When the DAC 150 receives the pulse P9 in the second pulse output $C_1$, the circuit unit B9 maintains the state and passes the enable state to the circuit unit B8 in response to the pulse P9.

Similarly, during a time for resolving the state for the circuit unit B8, the circuit unit B8 is initiated to the logic "1" state, and the DAC 150 settles the second voltage $V_{DAC}$ corresponding to a binary sequence "1100000000". Because the first voltage $V_{IN}$ is lower than the second voltage $V_{DAC}$, the comparator module 110 outputs a pulse in the first pulse output $C_0$ (e.g., P8 in FIG. 1). In response to the pulse output, the reset control circuit 120 resets the circuits in the comparator module 110. When the DAC 150 receives the pulse P8 in the first pulse output $C_0$, the circuit unit B8 switches to the logic "0" state and passes the enable state to circuit unit B7 in response to the pulse P8.

As shown in FIG. 3, each bit cycle includes a comparator reset time and a comparator decision time. During the comparator reset time, the circuit units in the DAC 150 switch logic states and the DAC 150 settles the second voltage $V_{DAC}$ accordingly.

Figure 4:
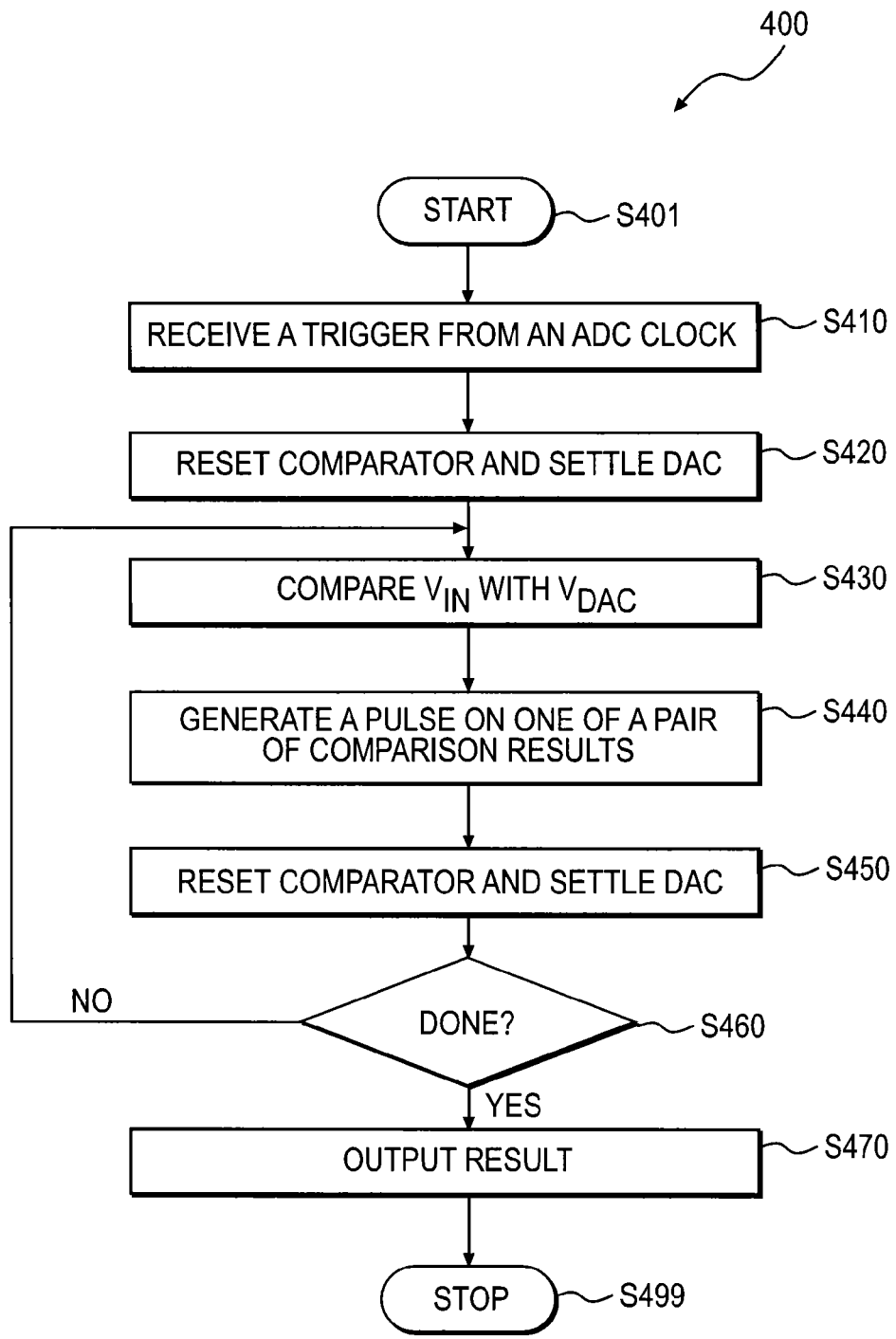
FIG. 4 shows a flow chart outlining a process example 400 according to an embodiment of the disclosure.

FIG. 4 shows a flow chart outlining a process example 400 according to an embodiment of the disclosure. The process can be executed by the ADC 101. The process starts at S401 and proceeds to S410.

At S410, the ADC 101 is triggered by the clock signal ADC_CLK. In an example, the ADC 101 starts operation in response to a rising edge of the clock signal ADC_CLK.

At S420, the ADC 101 performs an initial reset of the comparator module 110 and an initial settle of the DAC 150. For example, in response to the rising edge of the clock signal ADC_CLK, the reset control circuit 120 generates a reset pulse to reset the circuits in the comparator module 110, and the DAC 150 enables the circuit unit B9, and the circuit unit B9 enters an initial state, such as a logic "1" state. The other circuit units B8-B0 are not enabled and are in a default state, such as a logic "0" state. The DAC 150 settles the second voltage $V_{DAC}$ corresponding to the states of the circuit units B9-B0.

At S430, the comparator module 110 compares the first voltage $V_{IN}$ with the second voltage $V_{DAC}$.

At S440, the comparator module 110 generates a pulse based on the comparison. For example, when the first voltage $V_{IN}$ is higher than the second voltage $V_{DAC}$, the comparator module 110 generates a pulse in the second output signal $C_1$; and when the first voltage $V_{IN}$ is lower than the second voltage $V_{DAC}$, the comparator module 110 generates a pulse in the first output signal $C_0$.

At S450, the comparator module 110 resets in response to the pulse, and the DAC 150 resolves a bit based on the pulse. For example, the reset control circuit 120 generates a reset signal to reset the circuits in the comparator module 110 in response to the pulse. The enabled circuit unit corresponding to the bit resolves its state based on the pulse. In an example, when the pulse is in the first output signal $C_0$, the enabled circuit unit switches to a logic "0" state, and then enables a next circuit unit. When the pulse is in the second output signal $C_1$, the enabled circuit unit maintains the logic "1" state, and then enables a next circuit unit. When the next circuit unit is enabled, the next circuit unit enters a logic "1" state in an example. Further, the DAC 150 settles the second voltage $V_{DAC}$ corresponding to the states of the circuit units B9-B0.

At S460, the ADC 101 determines whether the conversion is done. For example, when the circuit unit corresponding to the least significant bit (LSB) is resolved, the DAC 150 sets a DONE signal to logic "1" for example, to indicate that all the digital bits have been resolved, otherwise, the DONE signal is logic "0". When the conversion is done, the process proceeds to S470; otherwise, the process returns to S430 to resolve the next bit.

At S470, the ADC 101 outputs the digital bits based on the states of the circuit units B9-B0. The process then proceeds to S499 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An analog-to-digital converter (ADC), comprising:
a comparator module configured to compare a first voltage sampled from an analog signal and a second voltage output from a digital-to-analog converter (DAC), and output a pulse to indicate a result of the comparison wherein the comparator module is configured to select one of a pair of output signals based on the result of the comparison and output the pulse in the selected output signal; and
the DAC configured to enable a switching unit corresponding to a digital bit to switch a state based on the pulse, and settle the second voltage.

2. The ADC of claim 1, wherein the comparator module is configured to avoid a pulse output from the non-selected output signal at the same time with the selected output signal.

3. The ADC of claim 1, wherein the comparator module further comprises:
a reset control circuit configured to reset circuits in the comparator module in response to the pulse.

4. The ADC of claim 3, wherein the comparator module resets at the same time the DAC settles the second voltage.

5. The ADC of claim 1, wherein the DAC comprises multiple switching units corresponding to digital bits of a digital value, and the multiple switching units are enabled in a chain to switch based on pulses output from the comparator module.

6. The ADC of claim 5, wherein the switching unit is configured to enable a next switching unit in the chain to switch based on a next pulse output from the comparator module.

7. The ADC of claim 1, wherein the comparator module does not output a clock signal.

8. A method, comprising:
comparing a first voltage sampled from an analog signal with a second voltage settled by a digital-to-analog converter (DAC);
selecting an output signal out of a pair of output signals based on the result of the comparison;
generating a pulse in the selected output signal to indicate a result of the comparison; and
enabling a switching unit in the DAC corresponding to a digital bit to switch a state based on the pulse.

9. The method of claim 8, further comprising:
avoiding a pulse output from the non-selected signal at the same time with the selected output signal.

10. The method of claim 8, further comprising:
resetting circuits for a next comparison in response to the pulse.

11. The method of claim 10, further comprising:
settling the second voltage output from the DAC at the same time of resetting the circuits.

12. The method of claim 8, wherein enabling the switching unit in the DAC corresponding to the digital bit to switch the state based on the pulse further comprises:
sequentially enabling switching units coupled in a chain corresponding to digital bits of a digital value to switch based on pulses.

13. The method of claim 12, further comprising:
enabling a next switching unit in the chain to switch based on a next pulse.

14. An integrated circuit (IC) chip having an analog-to-digital converter (ADC), the ADC comprising:
a comparator module configured to compare a first voltage sampled from an analog signal and a second voltage output from a digital-to-analog converter (DAC), and output a pulse to indicate a result of the comparison, wherein the comparator module is configured to select an output signal out of a pair of output signals based on the result of the comparison and output the pulse in the selected output signal: and
the DAC configured to enable a switching unit corresponding to a digital bit to switch a state based on the pulse, and settle the second voltage.

15. The IC chip of claim 14, wherein the comparator module is configured to avoid a pulse output from the non-selected output signal at the same time with the selected output signal.

16. The IC chip of claim 14, wherein the comparator module further comprises:
a reset control circuit configured to reset circuits in the comparator module in response to the pulse at the same time the DAC settles the second voltage.

17. IC chip of claim 14, wherein the DAC comprises multiple switching units corresponding to digital bits of a digital value, and the multiple switching units are enabled in a chain to switch based on pulses output from the comparator module.

* * * * *